United States Patent [19]
Kolanek

[11] Patent Number: 5,886,573
[45] Date of Patent: Mar. 23, 1999

[54] AMPLIFICATION USING AMPLITUDE RECONSTRUCTION OF AMPLITUDE AND/OR ANGLE MODULATED CARRIER

[75] Inventor: James Kolanek, Goleta, Calif.

[73] Assignee: Fujant, Inc., Santa Barbara, Calif.

[21] Appl. No.: 36,372

[22] Filed: Mar. 6, 1998

[51] Int. Cl.⁶ .............................. H03F 3/38; H03F 3/68
[52] U.S. Cl. ..................... 350/10; 330/124 R; 332/106
[58] Field of Search .................. 330/2, 10, 124 R, 330/149, 202 A, 251, 295; 332/106, 107, 108, 109; 455/126

[56] References Cited

U.S. PATENT DOCUMENTS

| | | | |
|---|---|---|---|
| 4,178,557 | 12/1979 | Henry | 330/10 |
| 4,462,001 | 7/1984 | Girard | 330/149 |
| 4,831,334 | 5/1989 | Hudspeth et al. | 330/10 |
| 5,132,637 | 7/1992 | Swanson | 330/10 |
| 5,249,201 | 9/1993 | Posner et al. | 332/106 X |
| 5,410,280 | 4/1995 | Linguet et al. | 330/10 X |
| 5,528,196 | 6/1996 | Baskin et al. | 330/151 |
| 5,576,660 | 11/1996 | Pouysegur et al. | 330/149 |
| 5,675,285 | 10/1997 | Winters | 330/124 R |
| 5,812,605 | 9/1998 | Smith et al. | 332/106 X |

OTHER PUBLICATIONS

Struble, et al., "Understanding Linearity in Wireless Communication Amplifiers", IEEE Journal of Solid–State Circuits, vol. 32, No. 9, Sep. 1997.

*Primary Examiner*—Steven Mottola
*Attorney, Agent, or Firm*—Blakely Sokoloff Taylor & Zafman LLP

[57] ABSTRACT

The present invention provides high power linear amplification of an amplitude and/or phase modulated signal using multiple saturated (or if desired, unsaturated) amplifiers driven by an appropriate set of switched, and/or phase modulated constant amplitude signals derived from the input signal. The present invention combines three amplitude reconstruction techniques and implements the amplitude reconstruction modulator digitally.

39 Claims, 12 Drawing Sheets

Frequency Plan After Sampling

Frequency Plan After Fs/4 Frequency Shift

Frequency Plan After Half Band Filtering

Frequency Plan After Decimation by 2

Frequency Plan Before And After Interpolation

Frequency Plan After Half Band Filtering

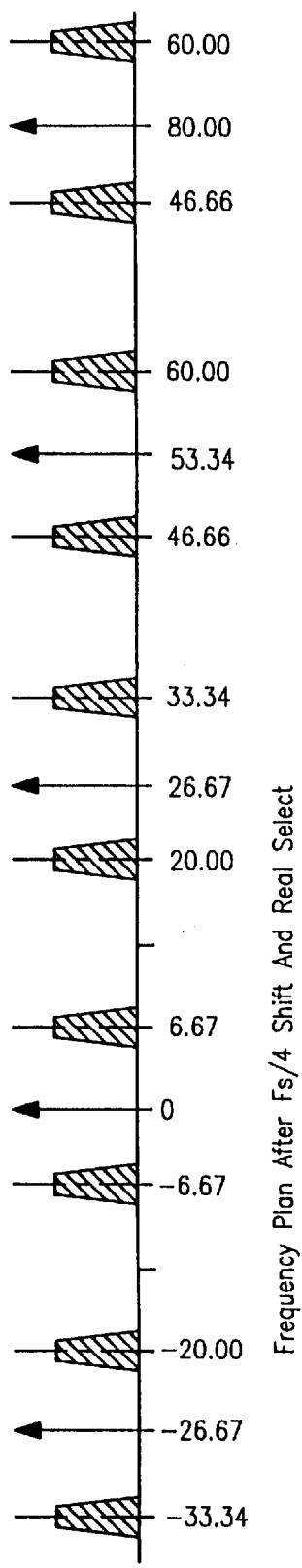
FIG. IOC
Frequency Plan After Fs/4 Shift And Real Select
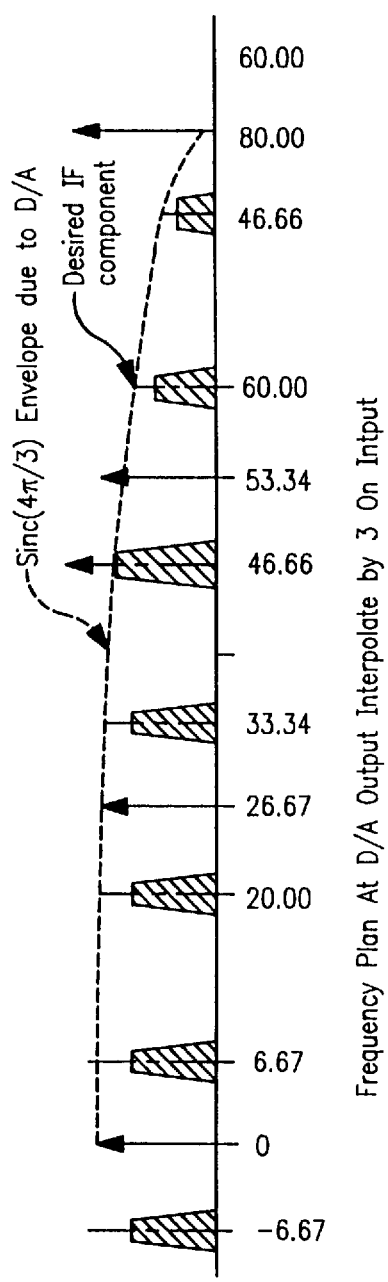
FIG. IOD
Frequency Plan At D/A Output Interpolate by 3 On Intput

AMPLIFICATION USING AMPLITUDE RECONSTRUCTION OF AMPLITUDE AND/ OR ANGLE MODULATED CARRIER

FIELD OF THE INVENTION

The present invention relates to the field of signal amplification; more particularly, the present invention relates to high power, low distortion amplification of an input comprising a single amplitude modulated carrier or a composite signal comprising multiple modulated carriers.

BACKGROUND OF THE INVENTION

A need exists to amplify signals comprising a single modulated carrier or a composite signal comprising several modulated carriers to high power levels for use in wireless communication base stations. The characteristics of the input signal require a high degree of linearity to substantially reduce and in some cases minimize distortion artifacts from appearing at the amplified output. In the RF frequency domain, standard high power amplifiers typically do not possess sufficient linearity to amplify either the single amplitude modulated RF signals nor the composite multiple RF carrier signals to meet stringent wireless base station requirements. Non-linear distortion products from such amplifiers can occur at the output in the form of spectral spreading or spectral regrowth of the modulated carriers or in spurious in band intermodulation products in the case of multiple RF carriers.

Currently, several techniques are used to compensate for high power amplifier non-linearity. For example, feedforward cancellation is a closed loop technique that introduces a compensation RF component into the output that cancels the nonlinear distortion products created by the amplifier. An example of a feedforward cancellation technique is described in U.S. Pat. No. 5,528,196, entitled "Linear RF Amplifier Having Reduced Intermodulation" (Baskum, et. al.), issued Jun. 18, 1996. Another technique is referred to as pre-distortion, which is a method to pre-distort the phase and amplitude of the input signal in a manner that counteracts and compensates for amplifier nonlinarity. The combination of the predistortion circuit and the nonlinear amplifier results in a net linear amplification. Examples of such an amplification technique are shown in U.S. Pat. No. 4,462,001, entitled "Baseband Linearizer for Wideband, High Power, Nonlinear Amplifiers" (Girard), issued Jul. 24, 1984 and U.S. Pat. No. 5,576,660, entitled "Broadband Predistortion Linearizer With Automatic Temperature Compensation For Microwave Amplifiers" (Pouysegur et. al.), issued Nov. 19, 1996.

Other prior art techniques are based on indirect methods of amplitude reconstruction. These methods generally separate the input signal into the amplitude and angle modulation components. The constant amplitude angle modulation component is easily amplified using nonlinear amplifiers. The amplitude modulation component is reintroduced into the output using one of several methods. In one method referred to as switched amplifiers, multiple power amplifiers are employed which are capable of being individually switched on and off to vary the power delivered to the load. In this method, the RF drive levels are switched on or off such that the number of active amplifiers is proportional to the signal envelope, or amplitude. When the multiple amplifier outputs are combined, the result is a signal whose envelope approximates that of the input signal. An example of this technique is shown in U.S. Pat. No. 5,132,637, entitled "RF Power Amplifier System Having Improved Distortion Reduction" (Swanson), issued Jul. 21, 1992. In another technique referred to as pulse modulation, the angle modulated component is further modulated with a pulse waveform prior to amplification. The pulse modulation frequency is selected to be much higher than the operating bandwidth of the input signal, and the duty cycle of the pulse waveform is adjusted to be proportional to the envelope modulation. The angle modulation which exists on the original signal is unaffected, but when the amplifier output is suitably band pass filtered, the original amplitude modulation is reintroduced onto the carrier waveform. An example of this technique is shown in U.S. Pat. No. 5,249,201, entitled "Transmission of Multiple Carrier Signals in a Nonlinear System" (Posner), issued Sep. 29, 1991. In a third technique referred to as phase modulation, a pair of high power amplifiers is required. The angle modulated carrier driving each amplifier is further separately and differentially phase modulated as a function of envelope signal. Phase modulation is introduced in a manner such that when the two amplifier output signals are combined, the imparted differential phasing causes the result to be amplitude modulated. An example of this technique is shown in U.S. Pat. No. 4,178,557, entitled "Linear Amplification With Nonlinear Devices" (P. Henry), issued Dec. 11, 1979.

In all of the latter three methods, a key element is the operation of the power amplifier(s) in a saturated or nearly saturated mode. This allows highly nonlinear amplifiers (such as Class C) to be used and also results in efficient power generation. In all cases, the result is linear amplification of the input signal. The degree of linear performance actually achieved generally depends on the precision of the implementation. Typically, linear dynamic range has been limited to 40 dB to 60 dB. Some systems, such as GSM, will require dynamic ranges on the order of 74 dB. Thus, a new approach is required to meet this requirement for very wide dynamic range.

SUMMARY OF THE INVENTION

A method and apparatus for amplifying a signal is described. In one embodiment, the present invention comprises a method and apparatus for separating an input signal into an amplitude modulation component and an angle modulation component, dividing the angle modulation component into multiple paths having amplifier stages, inducing amplitude modulation into the plurality of paths by performing amplifier switching, pulse duty cycle modulation and phase modulation, and combining outputs of the amplifier stages in each path to create an output signal. At least two of the parallel paths have a switch and/or a phase modulator preceding the amplifier stage of the path.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

A linear amplification technique is described. In the following description, numerous details are set forth, such as numbers of amplifiers, specific frequencies, numbers of adders, etc. It will be apparent, however, to one skilled in the art, that the present invention may be practiced without these specific details. In other instances, well-known structures and devices are shown in block diagram form, rather than in detail, in order to avoid obscuring the present invention.

The amplification technique provides high power linear amplification of an amplitude and/or phase modulated signal using multiple saturated (or if desired, unsaturated) amplifiers driven by an appropriate set of switched and/or phase modulated constant amplitude signals derived from the input signal. In one embodiment, the linear amplification technique combines three amplitude reconstruction techniques and implements the amplitude reconstruction modulator digitally. The combination of three independent techniques significantly increases the achievable dynamic or conversely reduces the precision required of any one of the modulation techniques.

Figure 1:
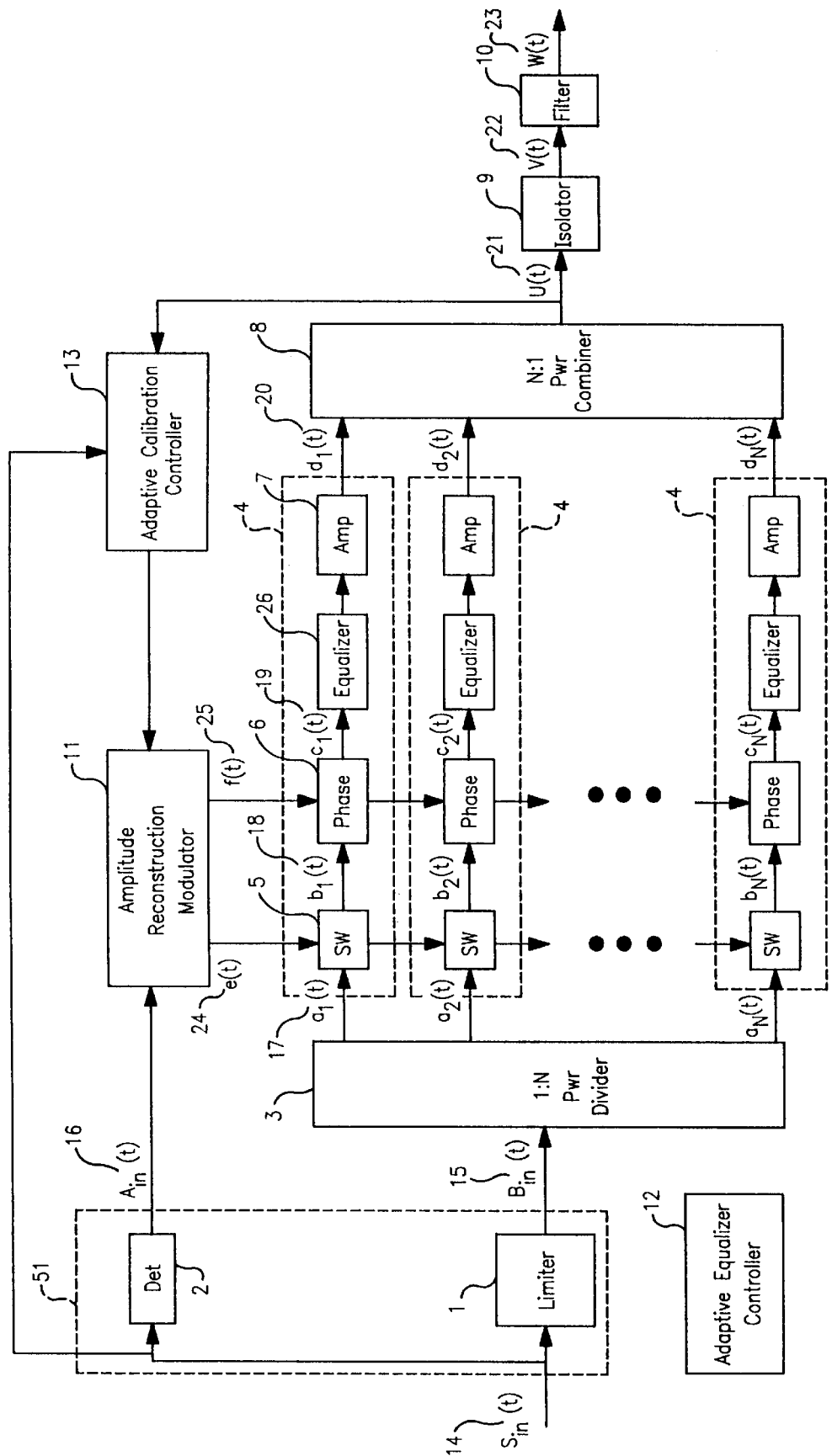
FIG. 1 is a block diagram of an amplifier performing a signal amplification and signal amplitude reconstruction process.

Referring to FIG. 1, one embodiment of the high power linear amplifier comprise signal separator 51 to separate the input signal $S_{in(t)}$ 14 into a phase, or angle, modulation component and an envelope, or amplitude, component. The input signal may comprise a single or multiple carrier signals. In one embodiment, signal separator 51 comprises (hard) limiter 1 and envelope detector 2. Other mechanisms (e.g., devices, functional units, circuits, etc.) to separate an input signal into angle modulation and envelope may be used.

A power divider 3 is coupled to receive the angle modulation component and divides the angle modulation component into the multiple, identical parallel paths. Multiple signal processing modules 4 are coupled to receive outputs $a_1(t)$–$a_N(t)$. In one embodiment, each of signal processing modules 4 comprises series switch 5, phase modulator (phase shifter) 6 and power amplifier 7 (i.e., an amplifier stage). In one embodiment, amplifiers 7 may comprise Class C amplifiers or other fully saturated RF amplifiers. The use of these amplifiers achieves linear amplification even though the amplifiers are not linear.

Amplitude reconstruction modulator 11 is coupled to signal separator 51, signal processing modules 4, and an optional adaptive calibration unit 13 and provides modulation signals to signal processing modules 4. Note that depending on the application, series switch 4 and phase modulator 6 can be used separately or together. That is, these elements may be applied individually.

Power combiner 8 combines outputs $d_1(t)$–$d_N(t)$ of the parallel amplifiers 7 of signal processing modules 4. Output protection and filtering is provided by isolator 9, which is coupled to the output of power combiner 8 and output filter 10, which is coupled to the output of isolator 9.

Additional units comprising an adaptive equalizer controller 12, equalizer filters 26, and the adaptive calibration unit 13 may be included, if required, to meet performance requirements imposed on the amplifier.

In operation, a composite input signal, $S_{in}(t)$, 14 which comprises single or multiple carriers, is separated into two paths, one containing only the envelope modulation component and the second containing only the angle modulation component. The angle modulation component, $B_{in}(t)$, 15 is obtained from limiter 1 (or some similar device).

Signal 15 is divided multiple (N) ways to provide a set of drive signals, $a_k(t)$, k=1, 2, ... N, 17 for each of N parallel signal processing modules 4.

Depending on the application, series switch 5 and/or phase modulator 6 can be used either separately, or in combination, depending on requirements for dynamic range, thereby allowing the dynamic range to be extended beyond that which is attainable by each of the techniques used above. Note that use of techniques in the amplifier described herein improves the efficiency of the amplifier.

Switch 5 allows amplifier switching and/or imparts a variable pulse width modulation (i.e. the duty cycle modulation), $e_k(t)$, 24 at a suitable sample rate on drive signal 17. Switch 5 is not necessary for many applications and is optional. The phase modulator 6 imparts a variable phase modulation, $f_k(t)$, 25 on drive signal 17. The resulting modulated drive signal, $c_k(t)$, 19 output from phase modulator 6 drives amplifier 7 at or near saturation. Drive signals 17 representing the phase component of the input signal, being a constant amplitude, normally drive each amplifier into or near saturation.

The signal envelope or amplitude modulation, obtained from envelope detector 2, is used to reconstruct the amplitude information of input signal 14 by controlling the state of each switch 5 and/or phase modulator 6 contained in signal processing modules 4. A combination of amplifier switching, pulse duty cycle modulation and/or phase modulation introduced into each path is used to induce amplitude modulation to appear at the output of power combiner 8, which is used to sum the outputs of the N paths. This amplitude modulation at the output of combiner 8 matches the amplitude modulation of input signal 14. The amplifier switching, pulse duty cycle and phase modulation are introduced in such a way as to not induce additional phase modulation to the output signal 23. Thus, the amplitude and phase modulation induced to appear at the output match the amplitude and phase modulation of the input signal.

Amplitude reconstruction modulator 11 provides independent control of each of signal processing modules 4. These N independent or similar duty cycle modulation signals 24 and/or phase modulation signals 25 are used to reintroduce amplitude modulation on output signal 23 proportional to input amplitude modulation component ($A_{in}(t)$) 16 of input signal 14 output from detector 2. Thus, in one embodiment, amplitude reconstruction is accomplished using duty cycle and/or phase modulation implemented via series switches and phase modulators.

Power combiner 8 performs a vector summation of amplifier output signals $d_k(t)$ 20. The magnitude of signal 21 at the output, $U_{(t)}$, of combiner 8 is dependent on the phase and amplitude of the modulated signals 20 output from amplifier 7 of each of signal processing modules 4. Ideally, the amplitudes of the signals 20 output from amplifier 7 of each of signal processing modules 4 are equal, making output signal 21 dependent only on the number of amplifiers activated, the duty factor of the pulse modulation and the added phase modulation 25.

Isolator 9 provides matched impedance for each amplifier 7 in signal processing modules 4 and additionally absorbs out of band spectral sidelobes introduced by duty cycle modulation 24 generated by each switch 5 in signal processing modules 4. Filter 10 performs a band limiting filtering operation to pass the central frequency components of signal, (V(t)), 22 while rejecting the spectral sidebands introduced by each switch 5 as duty cycle modulation 24 and/or introduced by each phase modulator 6 as phase modulation 25. Filter 10 further imparts additional amplitude modulation on its output signal, (W(t)), 23 by converting the duty cycle associated with duty cycle modulation 24 into amplitude modulation.

In one embodiment, an optional adaptive amplitude and phase calibration module 13 is coupled to compare output signal 21 of combiner 8 against a delayed version of input signal 14 (delayed so that the output and input comparison is made for the same instant of time). This comparison produces calibration signals which are driven to amplitude reconstruction modulator 11 and used for compensation of amplitude and phase imbalances that exist among the N parallel paths containing signal processing modules 4. The difference between the delayed input and the output of combiner 8 is driven to zero by adjusting the values used for the duty cycle and/or phase modulators.

Adaptive equalizer controller 12 and equalizer filters 26 may be included to equalize amplitude and phase variations between the channels. In other words, the use of equalizers may remove frequency response imbalances between channels.

Figure 2A:
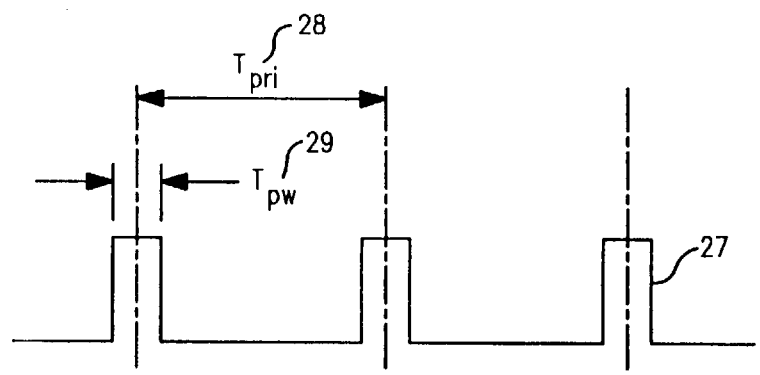
FIGS. 2a and 2b illustrate duty cycle and phase modulation for amplitude reconstruction.
Figure 2B:
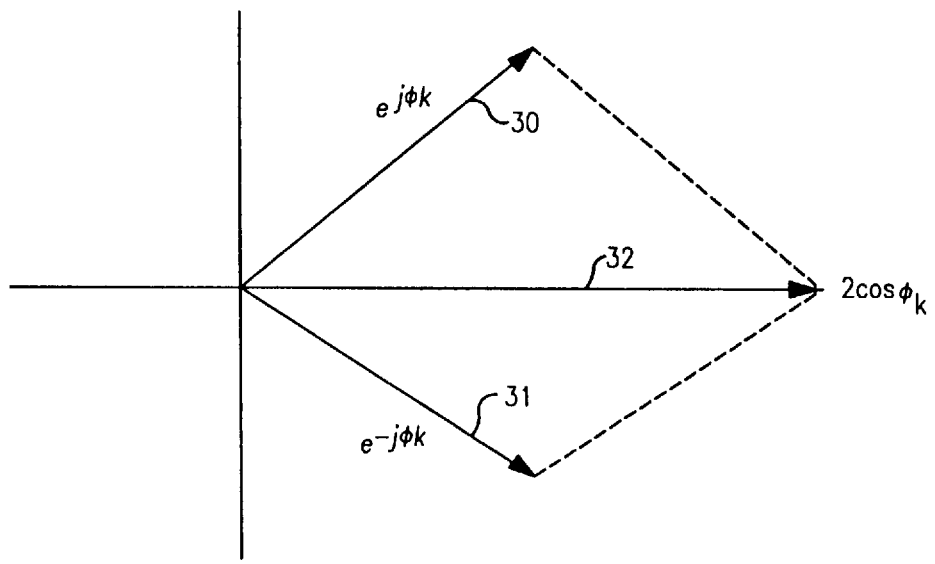

FIGS. 2a and 2b illustrate the amplitude reconstruction modulation performed by one embodiment of amplitude reconstruction modulator 11. Referring to FIG. 2a, pulse modulation waveform 27 is defined for the amplitude reconstruction pulse modulation applied to each switch 5 of signal processing modules 4. Pulses of variable width $T_{pw}$ 29 occur at a fixed interval $T_{pri}$ 28. The frequency associated with $T_{pri}$ 28 is selected to be sufficient to place spurious spectral components introduced by the pulse modulation outside the bandwidth of filter 10. Filter 10 removes the spurious spectral components and produces signal 23 which has an amplitude proportional to the duty cycle of waveform 27.

Additionally, switch 5 in each of signal processing modules 4 can be individually controlled by amplitude reconstruction modulator 11 to implement amplifier switching. In this case, the number of signal processing modules 4 activated, and consequently the number of amplifiers 7 turned on, is proportional to amplitude modulation component 16.

Referring to FIG. 2b, phase modulation is defined for the amplitude reconstruction phase modulation applied to pairs of signal processing modules 4. The signals passing through a pair of signal processing modules 4 are further modulated by the complex phasors 30 and 31. Let $\phi_k$ and $\phi_{k+1}$ be the phase shift applied to two of the signal processing modules 4. Phasors 30 and 31 represent the phase shift applied to the signals passing through signal processing modules 4. The resultant signal appearing at the output of combiner 8 is the vector sum of the original signal modified by resultant phasor 32. By controlling $\phi_k$ and $\phi_{k+1}$, considerable freedom exists to control both the phase and amplitude of phasor 32. When the amplifiers 7 in signal processing modules 4 are balanced, operating phases $\phi_k$ and $\phi_{k+1}$ differentially (i.e. $\phi_{k+1}=-\phi_k$) amplitude of output 32, B=2 cos(f) 33. When equal phase shifts are employed (i.e. $\phi_{k+1}=\phi_k$), then the net phase of $\phi_k$ or $\phi_{k+1}$ is imposed on output signal 21. In general, any phase pair combination can be decomposed into odd (differential) and even (equal) phase pairs. In a similar manner, other pairs of signal processing modules 4 produce similar results. The total output from combiner 8, therefore, is the vector sum of all the N phasors to produce the desired amplitude and/or phase modulation. Once calibration has achieved amplifier balance (phase and amplitude) amplitude modulation reconstruction is implemented using the relation $\phi_k(m)=-\phi_{k+1}(t)=\arccos(A(t)/A_{clip})$ where $A_{clip}$ is the clip level (maximum power output from the amplifier) for the amplitude modulated signal.

The preceding discussion assumes that all channels are balanced in both amplitude and phase. In normal operation, this is not the case and calibration is necessary. In one embodiment, the amplifier employs a calibration process supplies a fixed amplitude and phase correction to each channel. A technique for calibration is suggested in FIG. 3, FIG. 4 and FIG. 5.

Figure 3A:
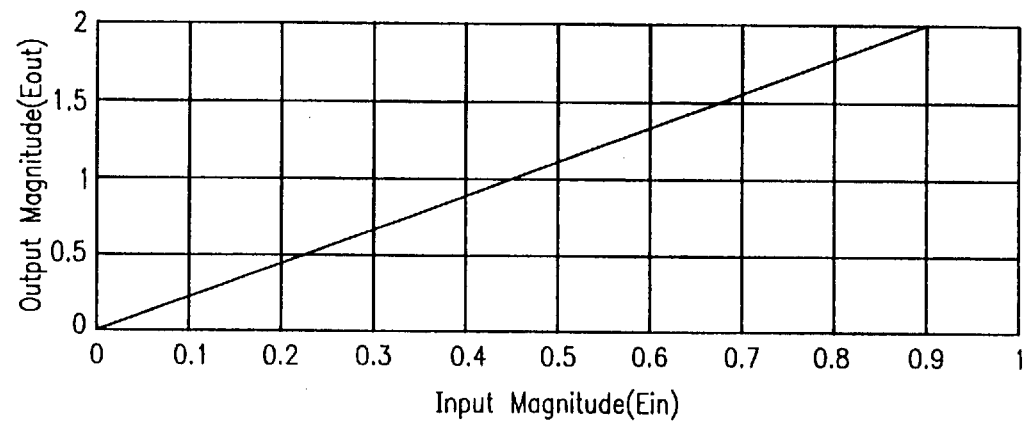
FIG. 3 illustrates AM/AM and AM/PM characteristics on an ideal amplifier.
Figure 3B:
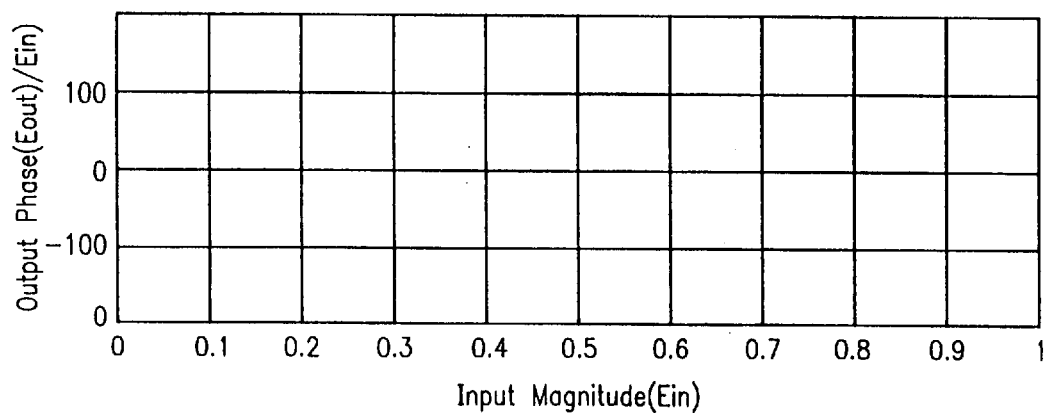

Referring to FIG. 3, there is shown the amplitude modulation to amplitude modulation (AM/AM) and amplitude modulation to phase modulation (AM/PM) characteristics, which should exist for an ideal balanced amplifier configuration. Here, the output amplitude, $A_{out}$, is linearly related to the input amplitude, $A_{in}$, up to the amplitude clip level, $A_{clip}$. The phase difference, $F_D$, between the output and input waveform is constant (zero in this case).

Figure 4A:
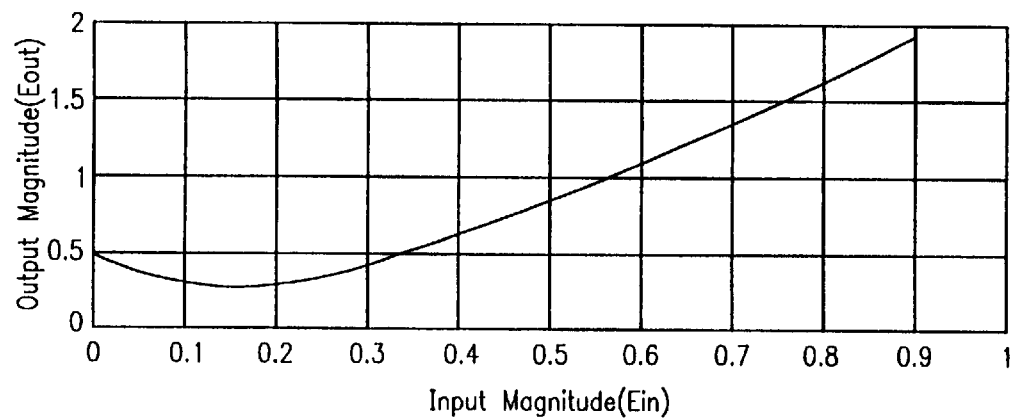
FIG. 4 illustrates AM/AM and AM/PM characteristics for an amplifier with phase and amplitude imbalance plotted vs. input envelope amplitude.
Figure 4B:
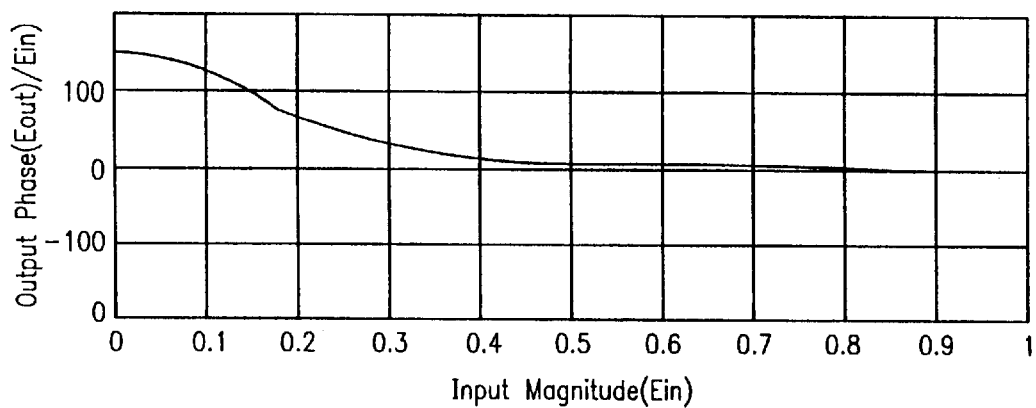

Referring to FIG. 4, there is shown an exemplary AM/AM and AM/PM characteristic for a specific amplitude and phase imbalance (Case 1 defined below). Let A1 and A2 refer to the amplitudes of the signals appearing at the input of a two-channel combiner. Let $\Phi_1$ and $\Phi_2$ be the phases of the two signals attributable to the two paths. Then let $\Phi_\Delta=\Phi_1-\Phi_2$ be differential phase of the two paths. Then the four cases are: Case 1 ($A_1>A_2 \& \Phi_\Delta<0$), Case 2 ($A_1<A_2 \& \Phi_\Delta<0$), Case 3 ($A_1>A_2 \& \Phi_\Delta>0$), and Case 4 ($A_1<A_2 \& \Phi_\Delta>0$). In all cases, an amplitude imbalance produces a situation where the output amplitude cannot reach zero value. Instead a minimum is reached whose depth and location depends on the amplitude and phase imbalance. This can be explained by referring to FIG. 2b. If the two phasors are represented by $A_1 \exp^{(j\Phi_1)}$ and $A_2 \exp^{(j\Phi_2)}$ respectively, then the resultant B 32 is given by $B=A_1 e^{(j\Phi_1)}+A_2 e^{(j\Phi_2)}$. The magnitude imbalance can be represented by a differential quantity $\Delta$, such that $A_1=(1+\Delta)A$ and $A_2=(1-\Delta)A$ where A is the nominal ideal magnitude. The phase imbalance can similarly be represented as a phase difference $\phi_0$ such that $\phi_1=\phi_0+b$ and $\phi_2=\phi_0-B$ where B is the amplitude reconstitution phase modulation. When these expressions in the preceding expression for the resultant phasor, the magnitude |B| becomes sqrt(4 $\cos^2(\phi_0+b)+4\Delta^2 \sin(\phi_0+B)$). This function reaches a minimum at B=90 deg$-\phi_0$ and has value $2\Delta$.

Figure 5A:
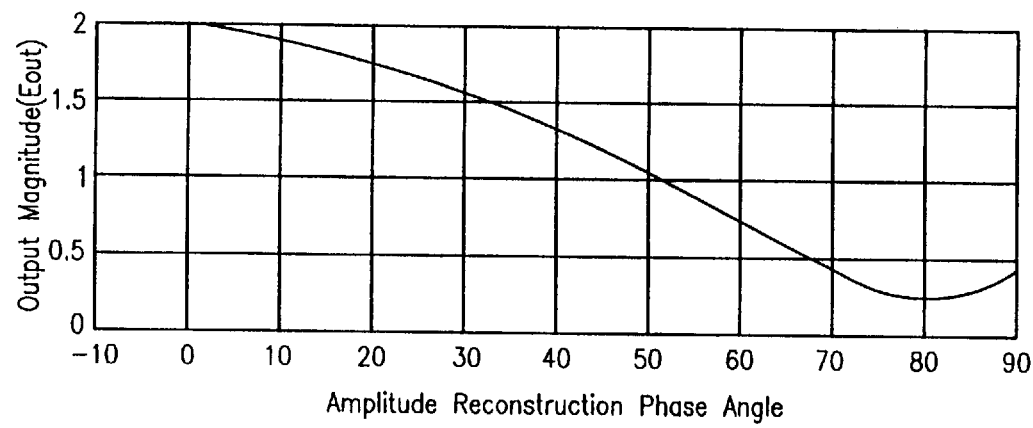
FIG. 5 illustrates amplitude and phase characteristics for an amplifier with phase and amplitude imbalance plotted vs. amplitude reconstruction phase modulation.
Figure 5B:
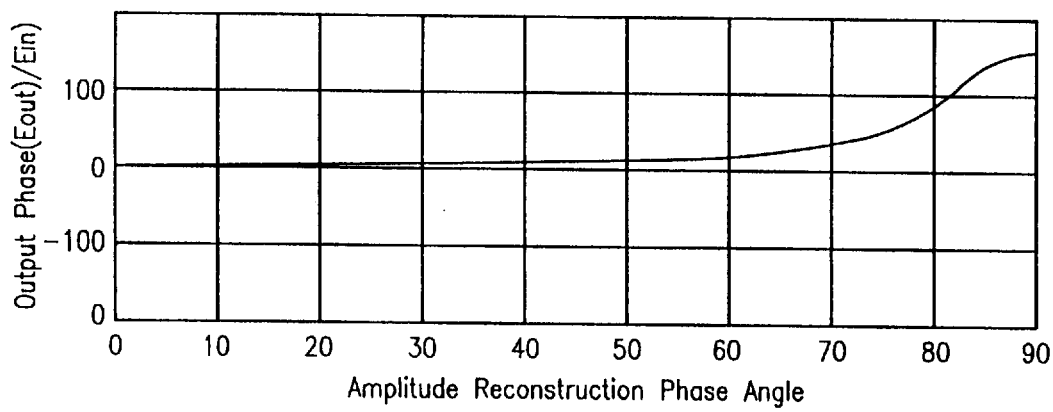

FIG. 5 illustrates a data equivalent to FIG. 4 except that output amplitude and differential phase is plotted against reconstruction phase $P_{mod}$. Estimates for the differential amplitude and phase imbalance can be obtained from such curves. The location of the null and the characteristics of the differential phase in the vicinity of the null indicates which of the four defined cases exist. Data needed to construct curves shown in FIG. 5 can be obtained directly from input signal 14 and from samples of output signal 21 during normal operation, thus eliminating the need for a special calibration cycle. In this case, when performing the calibration, two buffers store samples of the input signal and samples of the output signal being feedback. Input samples are sorted by amplitude and indexed based on their amplitude. Using the ordering and indexing of the samples of the input signal, the output samples are reordered. This allows for determining output sample amplitude versus input sample amplitude. The same steps may be taken with respect to plotting the phase difference between the input and output signals. Using the plots, estimates of the amplitude and phase imbalance may be obtained from the detected minimum. Once estimates of the amplitude and phase imbalance are obtained, phase and amplitude corrections can be applied to null both signals. As described below, phase and amplitude calibration signals are added to the phase 65 and amplitude 66 control signals shown in FIG. 8. In one embodiment, the process to null both signals is iterative in that the results of applying calibration signals to null both signals, a residual error is generated, requiring further calibration. The calibration process is then repeated. In one embodiment, the calibration does not attempt to null the entire error during a single calibration cycle. Instead, a percentage (e.g., one-half) of the error is iteratively corrected so as to migrate towards a reduction in the residual error. This helps maintain stability.

Figure 6:
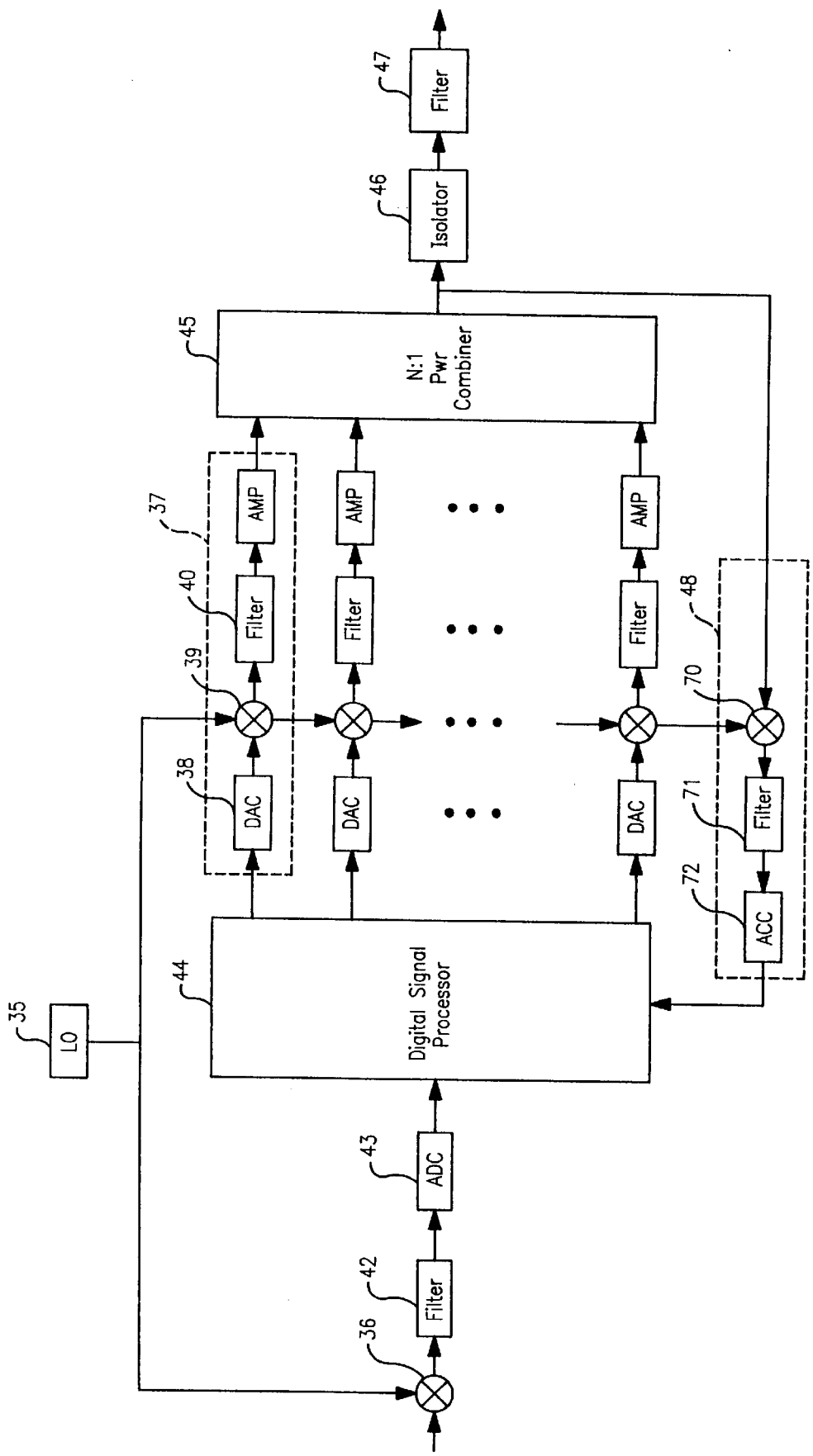
FIG. 6 is a block diagram of one embodiment of an amplifier using a digital signal processor.

FIG. 6 is a block diagram of an amplifier using a digital signal processor to implement the amplitude reconstruction modulator. This high power amplifier may be used as part of a transmitter in a communication system (e.g., a wireless communication system). Referring to FIG. 6, the input RF frequency signal and a signal from common local oscillator (LO) 35 are coupled to inputs of channel mixer 36, which converts the input RF frequency signal to an IF frequency range signal suitable for direct conversion by analog to digital converter (ADC) 43, after undergoing filtering by filter 42 to remove spurious signals resulting from the mixing operation.

The output of ADC 43 is coupled to the input of digital signal processor 44. Digital signal processor 44 performs amplitude reconstruction modulation. The resulting signals output from digital signal processor 44 drive amplifier channels that include amplifier channel modules 37. Each of the amplifier channel modules 37 comprises a digital to analog converter 38 which performs digital to analog conversion on a output from digital signal processor 44. The signal output from DAC 38 is mixed with the local oscillator frequency from local oscillator 35 using mixer 39. The output of mixer 39 is coupled to the input of filter 40, which filters the results of the mixing operation. The filter 40 outputs a drive signal to an amplifier 41.

The outputs of each of the amplifier channel modules 37 are coupled to the inputs of power combiner 45. Power combiner 45 combines multiple amplifier outputs via vector recombination. In one embodiment, power combiner 45 comprises a transmitter output. The results of the combining performed by power combiner 45 are input to isolator 46. The output of isolator 46 is coupled to the input of filter 47. Power combiner 45, isolator 46 and filter 47 operate in the same manner as their counterparts in FIG. 1.

The output of power combiner 45 is also fed back to a calibration receiver module 48 that comprises a mixer 70 that mixes the output of power combiner 45 with the frequency from local oscillator 45. The results of the mixing operation are filtered using a filter 71 and then undergo analog digital conversion using ADC 72. The signal output from ADC 72 is input to digital signal processor 44.

Figure 7A:
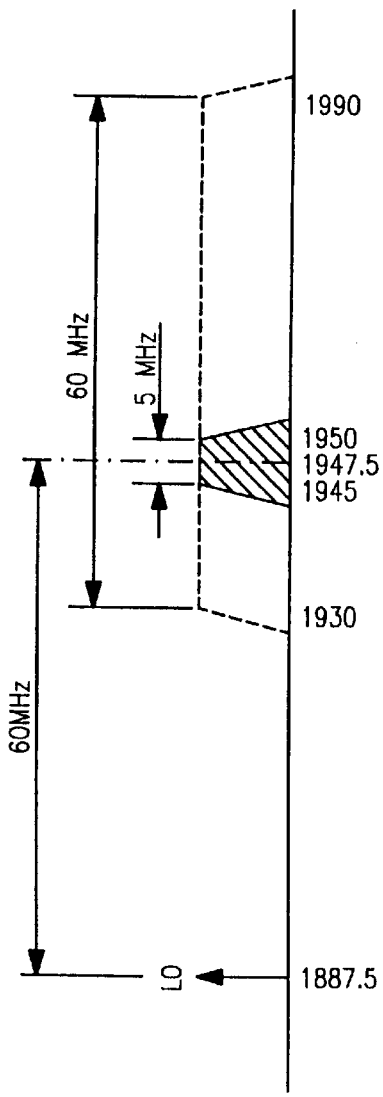
FIG. 7 illustrates the frequency plan for the input and calibration signals through the output of a digital to analog converter.
Figure 7B:
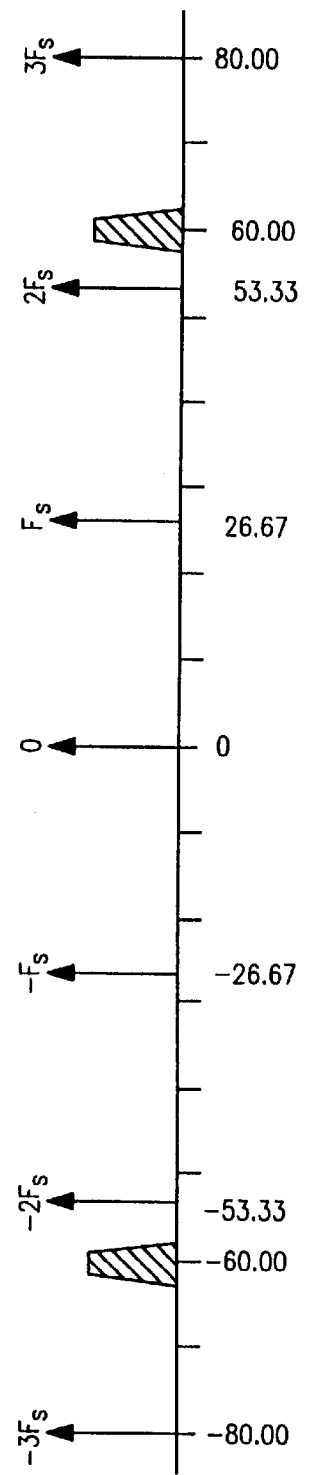
Figure 7C:
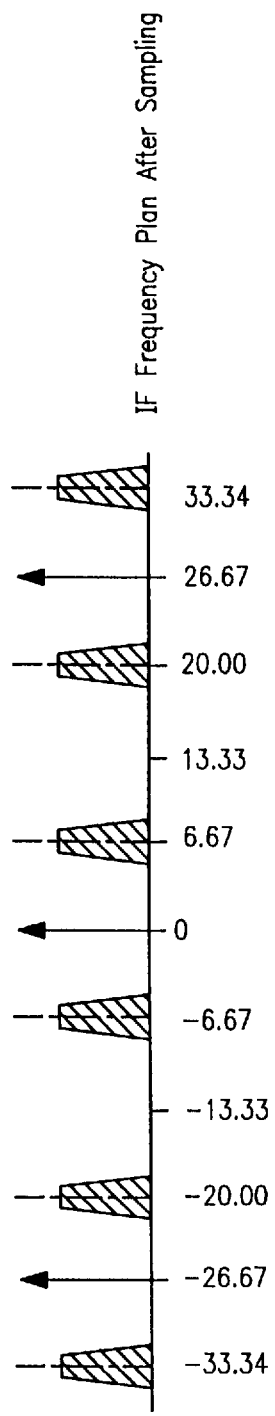

FIG. 7 illustrates an exemplary frequency plan for one such realization. FIG. 7a illustrates the desired input frequency band centered at 1947.5 MHz and a LO at 1887.5 MHz. FIG. 7b illustrates the spectrum after being translated to a 60 MHz IF along with harmonics of the ADC 26.67 MHz sample rate. FIG. 7c illustrates the resulting spectrum after sampling. Note that subharmonic sampling has been employed in this example that allows the sample frequency to be lower than the IF frequency.

Figure 8A:
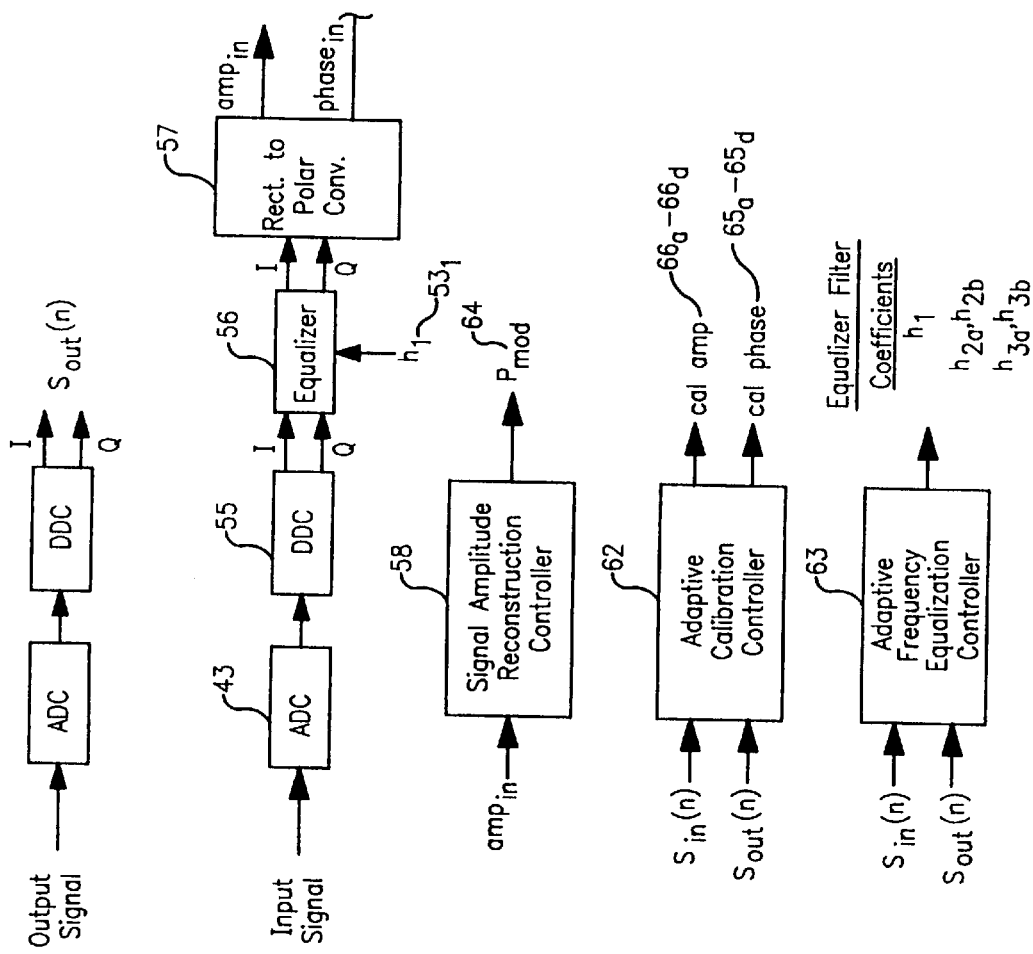
FIG. 8 is a block diagram of a digital processor.
Figure 9A:
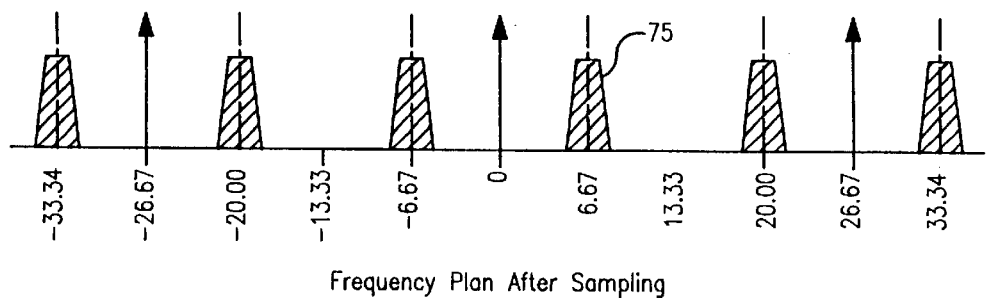
FIG. 9 illustrates the frequency plan for processing within a digital down converter.
Figure 9B:
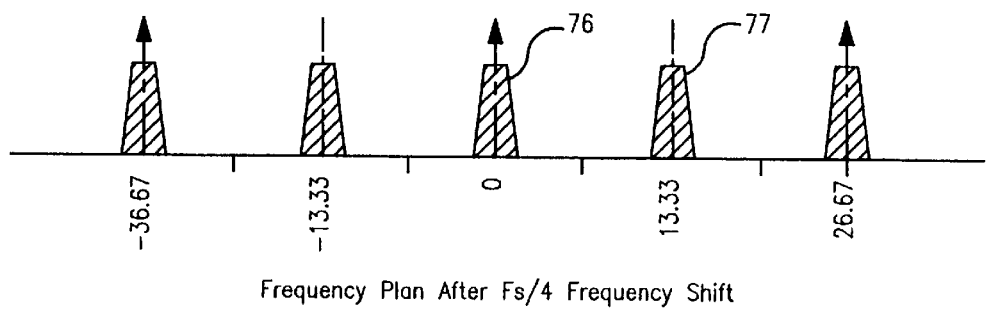
Figure 9C:
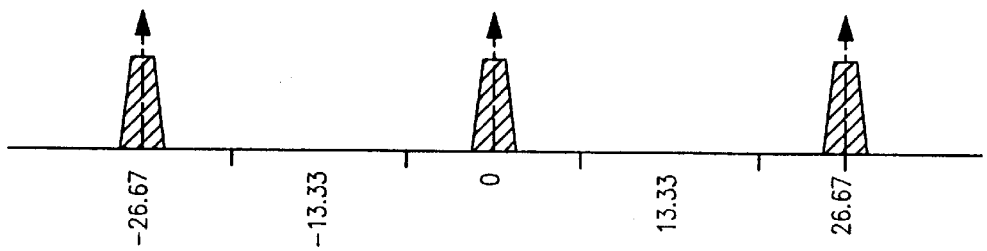
Figure 9D:
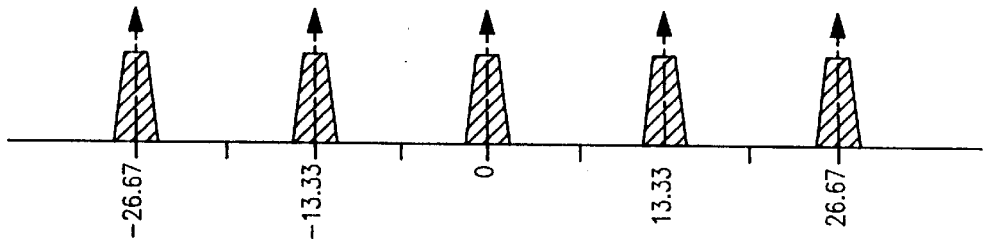

FIG. 8 is a block diagram of one embodiment of the digital signal processing. FIG. 9 illustrates additional detail of the frequency plan, incorporated into the digital signal processor. Referring to FIG. 8, the output of ADC 43 is coupled to the input of digital down converter (DDC) 55, which translates the signal frequency 75, by one quarter of the ADC sample rate (i.e. Fs/4) of ADC 43 to baseband 76, using a complex frequency translation. DDC 55 also filters this signal to remove the undesired harmonic component at Fs/2 77, and the output samples are decimated by a factor of two. The decimation reduces the sample rate. Thus, DDC 55 converts sampled real signals into complex baseband signals and decimates the complex baseband signals. The output of DDC 55 comprises an in-phase (I) component and a quadrature-phase (Q) component. FIG. 9d shows the resulting signal spectrum.

Input equalizer 56 equalizes amplitude and phase variations that may exist and which are common to all channels. In one embodiment, input equalizer 56 comprises a finite impulse response (FIR) filter that filters based on an equalizer filter coefficient generated by adaptive equalizer FIR coefficient generation module 63 in a manner well-known in the art.

Rectangular to Polar converter (R2P) 57 converts the rectangular coordinate in-phase (I) and quadrature-phase (Q) input to polar coordinate amplitude and phase format. The phase component represents the angle modulation component of the input signal while amplitude component represents the envelope component of the input signal.

The phase component is coupled to the input of phase modulation and distribution module 59. Phase modulation module 59 is also coupled to receive inputs from signal amplitude reconstruction phase modulation generation module 58 and optionally from adaptive phase and amplitude calibration signal generation module 62. In one embodiment, signal amplitude reconstruction module 58 provides phase modulation $P_{mod}$ 64 which is supplied to the two adders 596a and 59b contained in phase combining module 59. Note that $P_{mod}$ is added with adder 59a, while $P_{mod}$ is subtracted with adder 59b. Phase calibration signals 65a–d are added to the phase signal in each channel using adders 59c–f, respectively. The outputs of phase modulation module 59 are coupled to one input of polar to rectangular converters (P2R) 60. Amplitude calibration signals 66a–d from adaptive calibration module 62 are also applied to another input of each of converters 60. Amplitude calibration signals 66c–d are generated by adaptive calibration module 62.

P2R 60 converts the polar coordinate amplitude and phase input signals (the amplifier channel signals) into rectangular in-phase (I) and quadrature-phase (Q) signals. The outputs of each P2R 60 are coupled to inputs of output equalizers 54a–d, which equalize amplitude and phase variations that may exist. In one embodiment, equalizers 54c–d comprise FIR filters that operate based on equalizer coefficients generated by adaptive frequency equalization module 65 in a manner well-known in the art.

Transmit I and Q signals for each transmit channel are converted from complex baseband signals to real signals and interpolated by a Digital Up Converter (DUC) 61 located in each transmit channel, and then the digital signals are converted to analog format by Digital-to-Analog Converters (DAC) 38. These outputs drive the amplifier channels.

It should be noted that the embodiment described above advantageously includes no multipliers. Other embodiments may include multipliers.

Figure 10A:
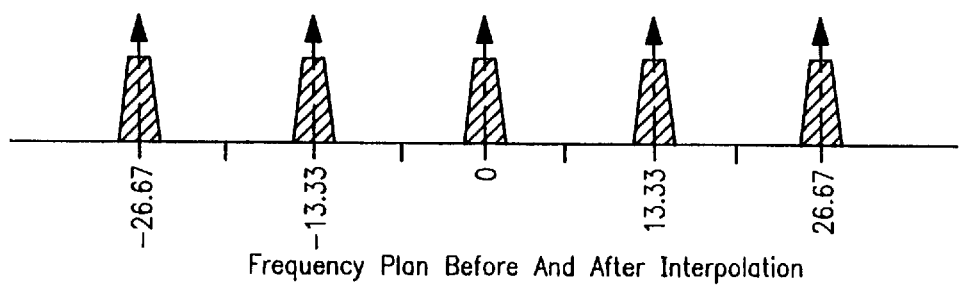
FIG. 10 illustrates the frequency plan for processing within a digital up converter and conversion by a digital to analog converter.
Figure 10B:
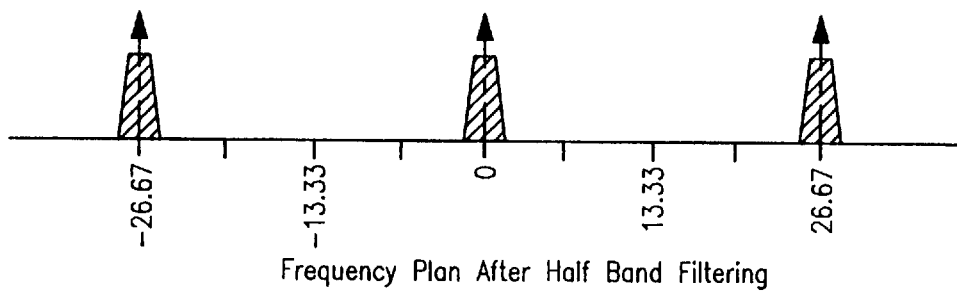

FIG. 10 illustrates a frequency plan for frequency conversion contained within the transmit channels. FIG. 10a shows the frequency plan present at the input of DUC 61. In one embodiment, DUC 61 first interpolates the signal by inserting zeros between samples to increase the sample rate, then filters the signal to remove the component at the new Fs/2. Finally, the signal is quarter band up shifted (i.e. Fs/4). Only the real part is kept to produce spectrum shown in FIG. 10c.

One embodiment of a calibration procedure follows. This procedure may be implemented in software, such that which runs on a digital signal, general purpose or dedicated processor, or with hardware (or a combination of both). First, referring to FIG. 1, a block of K samples of input $S_{in}(t)$ and output signals $U(t)$ are obtained. This may be accomplished by obtaining samples from ADCs 43 and 72 of FIG. 6. Let the block of sampled digitized signals be noted by $S_{in}(n)$ and $U(n)$ for n=0, 1, 2, . . . , K−1.

Next each set of signals is decomposed into their complex form:

$$S_{in}(n) = A_{in}(n) \exp(jB_{in}(n))$$

$$U(n) = A_{out}(n) \exp(jB_{out}(n))$$

Note that this form is automatically provided by digital signal processor 44 and amplifier modules 37.

Using these signals, Sin is adjusted to account for the time delay through digital signal processor 44 and amplifier modules 37:

$$\begin{aligned} S_{in}(n) &= S_{in}(n-p) \\ &= A_{in}(n-p)\exp(jB_{in}(n-p)) \\ &= \hat{A}_{in}(n)\exp(jB_{in}(n)) \end{aligned}$$

where p is the known or estimated time delay.

The data contained in the data blocks is arranged to obtain plots similar to those in FIG. 4 or FIG. 5. These plots are point by point plots of the corresponding delay adjusted samples (e.g., $S_{in}(n)$, $U(n)$). Note that:

$$A_{in} = \text{Magnitude}(E_{in})$$

$$A_{out} = \text{Magnitude}(E_{out})$$

$$B_{out} - B_{in} = \text{Phase}(E_{out}/E_{in})$$

corresponds to the labels used in FIG. 4 and FIG. 5. This procedure may be facilitated by first sorting $\hat{A}_{in}(n)$ in increasing order and then sorting the remaining variables (e.g., $B_{in}(n)$, $A_{out}(n)$, and $B_{out}(n)$) in the same order.

The phase and magnitude adjustments may be computed in a similar fashion as described previously.

It should be noted that some of the digital signal processing operations described herein may be performed in software, hardware, or a combination of the two. Such software may be run on, for example, a dedicated or general purpose machine, such as a computer system, while the hardware may comprise, for example, dedicated logic, circuits, etc. Also, although the above describes an embodiment that performs digital processing in the polar coordinate domain, the processing could be performed in the I and Q domain.

Accordingly, a technique for amplifying signals with complex amplitude and/or phase modulation is achieved by separating the signal into its envelope and angle modulated components, applying additional phase and/or pulse modulation to two or more copies of the angle modulated component, amplifying these components in separate constant amplitude amplifiers to high power levels, and combining the results to reintroduce the envelope modulation on the output, particularly using a combination of amplifiers switching, pulse modulation and phase modulation. Advantageous results are gained from the constant amplitude signals being amplified, since little or no additional phase or amplitude distortion is introduced by the high power linear amplifier. Furthermore, an embodiment is described which uses digital signal processing to generate the precision drive signals required by each amplifier.

Amplification techniques described herein provide numerous advantages. For instance, the amplification technique(s) provides for high powered linear amplification of signals possessing considerable amplitude and phase modulation with high fidelity and low distortion, which may be extended to composite signals comprising two or more modulated carriers. The high power linear amplification may be achieved using multiple simple low cost amplifiers operating at or near saturated power.

Additionally, in one embodiment, the present invention is advantageous in that it achieves the high power linear amplification using digital signal processing techniques to implement the amplitude reconstruction modulation. The digital implementation of the amplitude reconstruction modulator inherently provides greater precision than can be achieved using analog techniques and, thus, enables obtaining the accuracy and calibration needed to meet distortion requirements. Furthermore, the digital signal processing can be applied as an adjunct to current class C amplifiers (for example, such as those used in current AMPS BASE stations) for linearization purposes while also amplifying the amplitude and/or phase modulated signals using these amplifiers.

In one embodiment, the present invention allows for striking a balance between bandwidth and linearity, where the greater the bandwidth, the more linearity that may be obtained.

Moreover, the high power linear amplification is advantageous in that it achieves such amplification using a closed loop calibration technique which compares the delayed input carrier against the output amplified carrier for differences in a give instant of time and adjusts the amplitude reconstruction modulation process to remove (or null) the difference. Also in one embodiment an amplifier linearization technique is provided that uses amplitude and phase controls in a polar coordinates domain.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Many other variations are possible. For example, pulse modulation can be implemented by use of differential phase modulation eliminating the need for switch and pulse drive signals to the amplifier. Therefore, references to details of various embodiments are not intended to limit the scope of the claims which in themselves recite only those features regarded as essential to the invention.

Thus, a linear amplification technique has been described.

I claim:

1. An apparatus for amplifying an input signal comprising:
    a signal separator to separate the input signal into an amplitude component and a phase modulated component;
    a divider coupled to the signal separator to generate drive signals representing a plurality of replicas of the phase modulated component;
    a plurality of parallel paths coupled to the divider to receive the drive signals, wherein at least two of the plurality of paths comprising a switch and a phase modulator and each of the plurality of paths comprises an amplifier producing an amplified signal;
    a combiner coupled to sum outputs of amplifiers of the plurality of parallel paths to produce an amplified output; and
    an amplitude reconstruction controller coupled to the signal separator and said at least two paths to control each switch and phase modulator contained therein, wherein the amplitude reconstruction controller induces amplitude modulation to appear at the combiner output by introducing into the plurality of paths a combination of amplifier switching, pulse duty cycle modulation and phase modulation.

2. The apparatus defined in claim 1 wherein said each switch and phase modulator are used separately or in combination depending on dynamic range to extend the dynamic range beyond that attainable by each used alone.

3. The apparatus defined in claim 1 wherein amplitude modulation of the amplified output of the combiner matches amplitude modulation of the input signal.

4. The apparatus defined in claim 1 wherein the signal separator comprises:
    a limiter to generate the phase modulated component in response to the input signal; and
    a detector to generate the amplitude component in response to the input signal.

5. The apparatus defined in claim 1 wherein the detector comprises an envelope detector.

6. The apparatus defined in claim 1 further comprising an calibration unit coupled to the output and the amplitude reconstruction modulator to generate at least one calibration signal in response to the output, wherein the amplitude reconstruction modulator controls said each switch and phase modulator based on said at least one calibration signal.

7. The apparatus defined in claim 6 wherein the calibration unit generates said at least one calibration signal based on a comparison between the amplified output and a delayed version of the input signal, said at least one calibration signal causing the amplitude reconstruction modulator to compensate for amplitude and phase imbalances in the plurality of paths.

8. The apparatus defined in claim 7 wherein said at least one calibration signal causes a fixed amplitude and phase correction to be applied to each of the plurality of parallel paths.

9. The apparatus defined in claim 1 further comprising an isolator coupled to the amplified output and a filter coupled to the isolator to absorb distortion products and out of band harmonics at the combiner output.

10. The apparatus defined in claim 1 further comprising a phase modulation combining module having a pair of adders to add and subtract phase modulation generated by the amplitude reconstruction controller to the phase modulation component first and second half channels respectively.

11. The apparatus defined in claim 10 further comprising a calibration module to generate phase calibration signals, and wherein the phase modulation combining module further comprises a plurality of adders to add the phase calibration signals to the outputs of the pair of adders.

12. A method of amplifying an input signal comprising the steps of:
    removing amplitude modulation from the input signal;
    dividing the angle modulation component into a plurality parallel paths having amplifier stages, wherein at least two of the plurality of parallel paths have a switch and a phase modulator preceding the amplifier stage of the path;
    inducing amplitude modulation into the plurality of paths by performing amplifier switching, pulse duty cycle modulation and phase modulation; and
    combining outputs of the amplifier stages in each path to regenerate an output signal having the amplitude and phase modulation of the input signal.

13. The method defined in claim 12 further comprising the step of amplifying signals in the plurality of paths in a constant amplitude mode.

14. The method defined in claim 12 further comprising the step of applying phase modulation before amplifiers in the plurality of paths.

15. The method defined in claim 12 further comprising the step of modulating signals on all the plurality of paths with the same duty cycle modulation.

16. The method defined in claim 12 further comprising the step of applying amplifier channel switching differently for amplifiers of at least two of the plurality of paths.

17. The method defined in claim 12 wherein the amplitude modulation induced to appear at the output signal matches the amplitude modulation of the input signal.

18. The method defined in claim 12 wherein the phase modulation induced to appear at the output signal matches the phase modulation of the input signal.

19. The method defined in claim 12 further comprising the step of feeding back the output to provide calibration to compensate for mismatch of the plurality of paths.

20. An apparatus for amplifying a signal comprising:
    means for separating an input signal into an amplitude modulation component and an angle modulation component;
    means for dividing the angle modulation component into a plurality parallel paths having amplifier stages, wherein at least two of the plurality of parallel paths include a switch and a phase modulator;
    means for inducing amplitude modulation into the plurality of paths by performing amplifier switching, pulse duty cycle modulation and phase modulation; and
    means for combining outputs of the amplifier stages in each path to create an output signal.

21. The method defined in claim 20 wherein the amplitude modulation induced to appear at the output signal matches the amplitude modulation of the input signal.

22. The method defined in claim 20 further means for feeding back the output to provide calibration to compensate for mismatch of the plurality of paths.

23. An amplifier to amplify an input signal to high power levels with low distortion, said amplifier comprising:
    means for separating the input signal into its envelope and phase modulated components;
    means for providing replicas of the phase modulated component to each of a plurality of parallel channels;

means for imparting pulse and/or phase modulation in each of the plurality of parallel channels;

means for generating switch and phase modulation for amplitude reconstruction based on a function of the signal envelope, wherein the means for generating supplies signals to each of the plurality of parallel channels;

means for controlling amplitude reconstruction based on a combination switched amplifier, pulse duty cycle, and differential phase modulation;

a plurality of amplifier means for amplifying the phase modulated component in each or any combination of the plurality of parallel channels; and combining means for summing the output of the plurality of amplifiers means.

24. The amplifier defined in claim 23 wherein the combining means comprises a power combiner.

25. The amplifier defined in claim 23 further comprising means for absorbing out of band harmonics and distortion products at the output of the means for combining.

26. The amplifier defined in claim 25 wherein the means for absorbing comprises an isolator and a filter.

27. The amplifier defined in claim 20 wherein the means for absorbing approximately minimizes the out of band harmonics and distortion products.

28. The amplifier defined in claim 18 further comprising a calibration module having:

means for selecting samples of both the input and output signals;

means for generating AM/AM and AM/PM response data from the samples;

means for generating fixed phase and amplitude calibration signals for each of a plurality of parallel amplifier channels based on analysis of the AM/AM and AM/PM response data;

means for imparting phase, amplitude and/or pulse width correction into one or more of the plurality of parallel amplifier channels;

means for performing calibration to null residual phase and amplitude imbalances that exist in the plurality of parallel amplifier channels.

29. The amplifier defined in claim 23 wherein the plurality of parallel amplifier channels comprise fully saturated RF amplifiers.

30. The amplifier defined in claim 29 wherein the fully saturated RF amplifiers comprise Class C amplifiers.

31. An amplifier comprising:

means for performing analog to digital conversion to sample an analog input and calibration signals centered at an intermediate frequency (IF);

means for converting sampled the signals into complex baseband signals;

means for performing rectangular to polar conversion on the complex baseband signals to generate amplitude and phase modulated components;

means for computing pulse and/or phase modulation for reconstituting amplitude modulation based on vector recombination of multiple amplifier outputs;

means for generating and combining amplitude and phase calibration signals with amplitude reconstruction modulation signals to generate signals to drive a plurality of amplifier channels;

means for performing polar to rectangular conversion on signals from each of the amplifier channels to reconstitute I and Q signals; means for converting complex baseband signals on each of the signals from the amplifier channels into real signals; and means for converting the digital signal on each of the amplifier channel signals into analog signals centered at the IF.

32. The amplifier defined in claim 31 further comprising means for decimating the complex baseband signals prior to rectangular to polar conversion.

33. The amplifier defined in claim 31 further comprising means for interpolating data corresponding to the real signals prior to conversion of the digital signals of the amplifier channels into analog signals.

34. An apparatus for amplifying an input signal comprising:

an analog-to-digital converter (ADC);

a digital signal processor coupled to the ADC, where the digital signal processor comprises:

a rectangular to polar converter coupled to the ADC to convert the rectangular coordinate in-phase (I) and quadrature-phase (Q) input into a polar coordinate amplitude and phase format, a phase modulation combining module to provide phase modulation to the polar coordinate phase component, and a plurality of polar to rectangular converters coupled to the phase modulation combining module to convert amplitude and phase components from polar coordinates into rectangular coordinates; and a plurality of amplifier modules, each being coupled to one of the plurality of polar to rectangular converters;

a combiner coupled to sum outputs of amplifiers of the plurality of amplifier modules to produce an amplified output.

35. The apparatus defined in claim 34 wherein each of the amplifier modules comprises a digital analog converter (DAC) coupled to an output of one of the plurality of polar to rectangular converters, and an amplifier coupled to the output of the DAC.

36. The apparatus defined in claim 34 wherein each of the channel amplifier modules further comprise:

a mixer coupled to the output of the DAC to mix a signal output from the DAC with a local oscillator frequency; and a filter coupled to the output of the mixer, wherein the output of the filter is coupled to the input of the amplifier of said each of channel amplifier modules.

37. The apparatus defined in claim 34 further comprising a digital down converter coupled to the input signal;

a plurality of digital up converters coupled to the plurality of polar to rectangular converters to upconvert signals received from the polar to rectangular converters.

38. The apparatus defined in claim 34 further comprising a plurality of output equalizers coupled between the plurality of polar to rectangular converters and the plurality of digital up converters.

39. The apparatus defined in claim 27 further comprising an input equalizer coupled between the digital down converter and the rectangular to polar converter.

* * * * *